US008507909B2

(12) United States Patent
Tain et al.

(10) Patent No.: US 8,507,909 B2
(45) Date of Patent: Aug. 13, 2013

(54) MEASURING APPARATUS THAT INCLUDES A CHIP WITH A THROUGH SILICON VIA, A HEATER HAVING PLURAL SWITCHES, AND A STRESS SENSOR

(75) Inventors: Ra-Min Tain, New Taipei (TW);
Ming-Ji Dai, Hsinchu (TW);
Shyh-Shyuan Sheu, Hsinchu County (TW); Chih-Sheng Lin, Tainan (TW);
Shih-Hsien Wu, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 110 days.

(21) Appl. No.: 13/308,523

(22) Filed: Nov. 30, 2011

(65) Prior Publication Data
US 2012/0068177 A1    Mar. 22, 2012

Related U.S. Application Data

(63) Continuation-in-part of application No. 12/962,658, filed on Dec. 8, 2010.

(60) Provisional application No. 61/356,047, filed on Jun. 18, 2010.

(51) Int. Cl.
*H01L 23/58*    (2006.01)

(52) U.S. Cl.
USPC ............ 257/48; 257/417; 257/467; 257/621; 257/E23.081

(58) Field of Classification Search
USPC ........... 257/470, E21.522, E21.524, E23.081, 257/E29.347
See application file for complete search history.

(56) References Cited

U.S. PATENT DOCUMENTS

| 6,184,773 | B1 * | 2/2001 | Bonne et al. ............... 338/25 |
| 6,825,539 | B2 | 11/2004 | Tai et al. |
| 6,877,385 | B2 | 4/2005 | Fang et al. |
| 6,910,384 | B2 | 6/2005 | Tomka et al. |
| 7,066,031 | B2 | 6/2006 | Zdeblick et al. |
| 7,357,035 | B2 | 4/2008 | Liu et al. |
| 7,553,681 | B2 | 6/2009 | Raravikar et al. |
| 7,674,638 | B2 | 3/2010 | Okudo et al. |
| 2009/0152656 | A1 | 6/2009 | Okudo et al. |
| 2009/0267165 | A1 | 10/2009 | Okudo et al. |
| 2010/0078753 | A1 * | 4/2010 | Mehregany et al. ......... 257/467 |

FOREIGN PATENT DOCUMENTS

| JP | 2000174416 | 6/2000 |
| TW | 201017850 | 5/2010 |

OTHER PUBLICATIONS

Xiaowu Zhang et al., "Application of piezoresistive stress sensors in ultra thin device handling and characterization", Sensors and Actuators A: Physical, Nov. 2009, p. 2-p. 7.

Jeffrey C. Suhling et al., "Measurement of backside flip chip die stress using Piezoresistive test die", International Symposium on Microelectronics, Oct. 1999, p. 298-p. 303.

Jeffrey C. Suhling et al., "Silicon piezoresistive stress sensors and their application in electronic packaging", IEEE Sensors Journal, Jun. 2001, p. 14-p. 29.

"First Office Action of China Counterpart Application", issued on Feb. 17, 2013, p. 1-p. 5.

* cited by examiner

*Primary Examiner* — Stephen W Smoot
(74) *Attorney, Agent, or Firm* — Jianq Chyun IP Office

(57) ABSTRACT

A measuring apparatus including a first chip, a first circuit layer, a first heater, a first stress sensor and a second circuit layer is provided. The first chip has a first through silicon via, a first surface and a second surface opposite to the first surface. The first circuit layer is disposed on the first surface. The first heater and the first stress sensor are disposed on the first surface and connected to the first circuit layer. The second circuit layer is disposed on the second surface. The first heater comprises a plurality of first switches connected in series to generate heat.

28 Claims, 10 Drawing Sheets

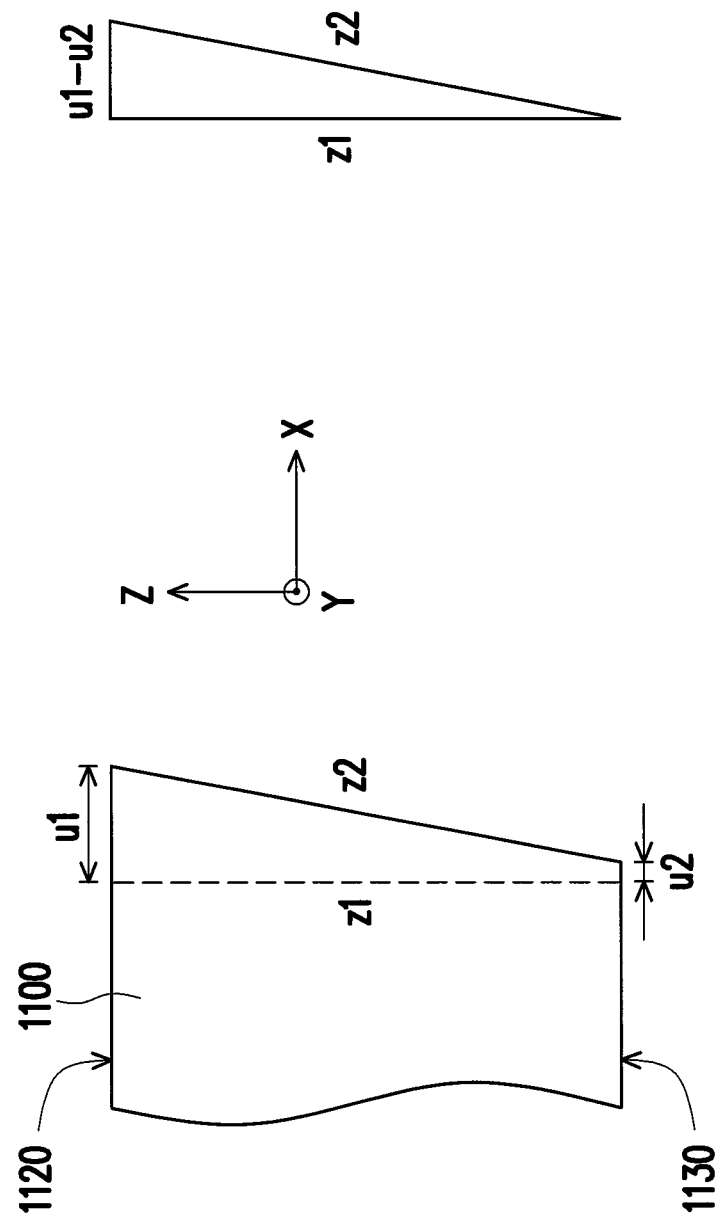

MEASURING APPARATUS THAT INCLUDES A CHIP WITH A THROUGH SILICON VIA, A HEATER HAVING PLURAL SWITCHES, AND A STRESS SENSOR

CROSS-REFERENCE TO RELATED APPLICATION

This is a continuation-in-part application of U.S. patent application Ser. No. 12/962,658, filed on Dec. 8, 2010, which claims the priority benefit of U.S. provisional application Ser. No. 61/356,047, filed on Jun. 18, 2010. The entirety of each of the above-mentioned patent applications is hereby incorporated by reference herein and made a part of this specification.

BACKGROUND

1. Technical Field

The disclosure relates to an apparatus. Particularly, the disclosure relates to a measuring apparatus.

2. Description of Related Art

As electronic system products are gradually miniaturized, various devices originally crowded on a circuit board are gradually packaged in a single package structure, and are further integrated to a single chip of heterogeneous integration. Though, during the integration process, a multi-function and heterogeneous single chip structure requires different manufacturing processes in accordance with different materials. However, considerable time and investment have to be spent with respect to such situation. Facing to a current market pattern of short product cycles and low-cost requirements, development of the system integration heterogeneous chip is rather uneconomic. Therefore, to integrate chips of different functions in a same package structure becomes a worthy development direction.

Current techniques for integrating different chips into the same package structure include a system on chip (SoC) technique and a system in package (SiP) technique, etc. In these techniques, a plurality of chips is generally packaged as a package device, in which the chips can be evenly distributed on a substrate, or the chips can be directly stacked. Moreover, another solution is to stack different chips into a whole group of chips according to a bump stacking method (which is usually performed in collaboration with wafer thinning).

In the bump stacking structure, since multiple layers of the chips are stacked through bump bonding, the complexity of the structure is increased. After the chips are stacked through the bump bonding, to observe a thermal stress/strain state of each chip and each bump caused by thermal expansion coefficient differences of different chips, or mechanical stress/strain caused by external force or gravity, new measurement methods have to be developed to effectively and promptly obtain the stress/strain states of the chips, so as to use such real-time information to accelerate design and process improvement to enhance competitiveness.

SUMMARY

The disclosure is directed to a measuring apparatus, which can measure stresses of chips under various temperatures.

The disclosure provides a measuring apparatus including a first chip, a first circuit layer, a first heater, a first stress sensor and a second circuit layer. The first chip has a first through silicon via, a first surface and a second surface opposite to the first surface. The first circuit layer is disposed on the first surface. The first heater is disposed on the first surface and is electrically connected to the first circuit layer. The first stress sensor is disposed on the first surface and is electrically connected to the first circuit layer. The second circuit layer is disposed on the second surface. The first heater comprises a plurality of first switches connected in series to generate heat.

According to the above descriptions, the measuring apparatus can use the heater to simulate various operating temperatures, so as to measure thermal resistances of the chip under various operating temperatures. Meanwhile, the heater comprising the switches provides simulation condition with precise temperature control.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 3A is a schematic diagram illustrating stresses/strains of a chip in three-dimensional directions.

FIG. 3B is diagram illustrating an equivalent geometric figure.

DETAILED DESCRIPTION

Figure 1A:
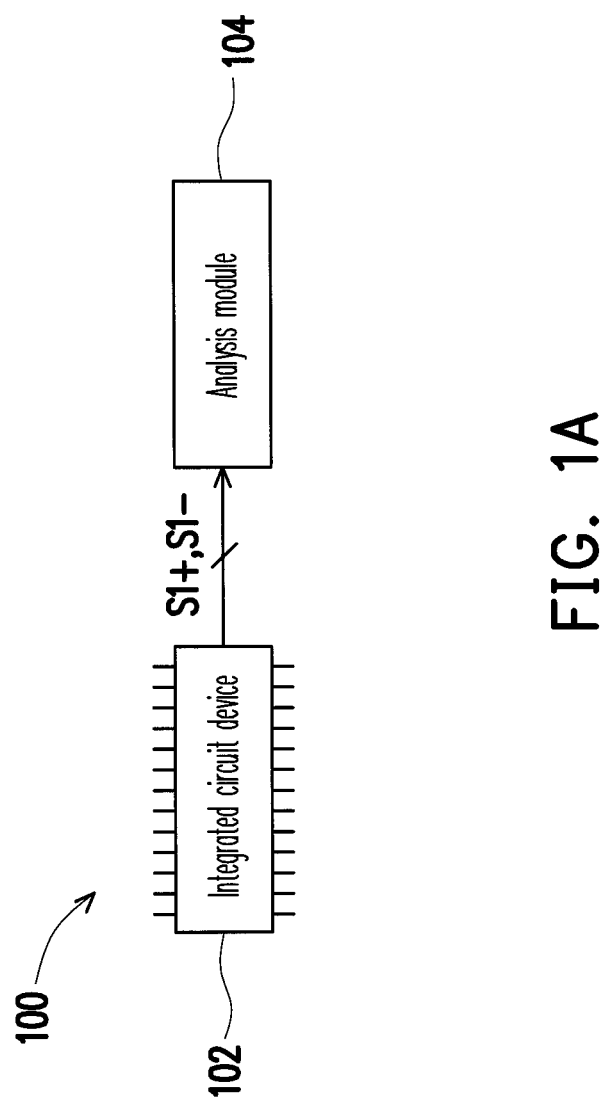
FIG. 1A is a system block diagram of a measurement system according to an exemplary embodiment of the disclosure.

FIG. 1A is a system block diagram of a measurement system according to an exemplary embodiment of the disclosure. Referring to FIG. 1A, the measurement system 100 of the present exemplary embodiment may measure an integrated circuit (IC) device 102 having a stacking structure. Wherein, at least one sensor (which is described in detail later) is disposed in internal of the IC device 102 for measuring a resistance of an internal chip of the IC device 102 and producing a set of sensing signals S1+ and S1−. The sensing signals S1+ and S1− can be transmitted to an analysis module 104 through an output terminal of the IC device 102. In this way, the analysis module 104 can detect internal stress/strain variations of the IC device 102 according to the sensing signals S1+ and S1−.

The analysis module 104 can be a hardware measurement device or an analysis software, or can even be a single chip, which is not limited by the disclosure. The analysis module 104 may analyse the internal stress/strain variation of the IC device 102 according to a following principal.

Figure 1C:
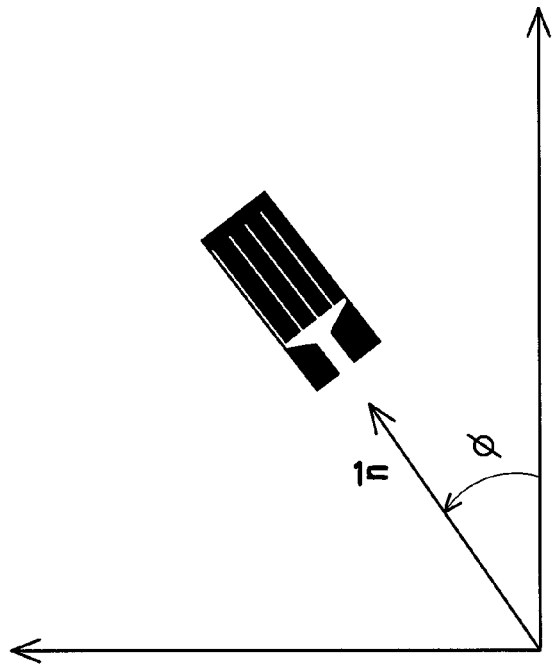
FIG. 1C shows an angle between the piezoresistive measuring device and the coordinate axis.
Figure 1B:
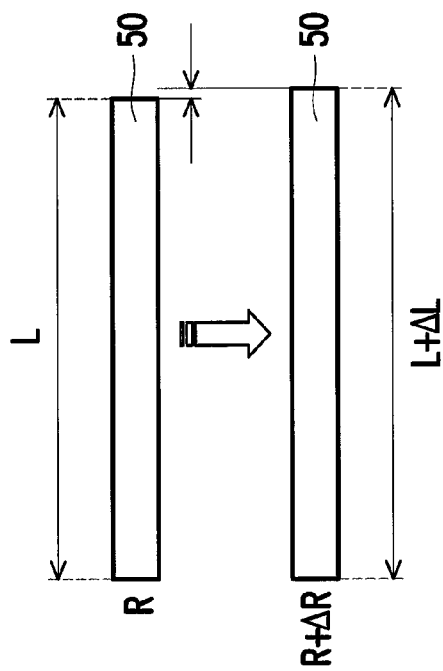
FIG. 1B shows a conductive material stretched under an external force.

The disclosure provides a testing apparatus for measuring a thermal resistance and a stress/strain value of a three-dimensional stacked chip structure containing through silicon vias, by which not only a strain value of a chip of each layer can be directly measured, a stress distribution of the chip of each layer can also be indirectly obtained. Generally, a basic principle of strain gauge measurement is to use a length variation of a conductor or a semiconductor material to produce a tiny variation of a resistance thereof. As shown in FIG. 1B, a conductive material 50 originally has a length of L, and is increased by a tiny length ΔL under an external force, and a resistance R thereof is also increased by ΔR. If a relationship of the length variation ΔL and the resistance variation ΔR is found, the strain value thereof is obtained since the strain value is equal to the length variation ΔL divided by the original length L (ΔL/L). Generally, a resistance of a conductor is proportional to a length of the conductor and inversely proportional to a cross-sectional area of the conductor besides relating to its own characteristics, so that the length variation and a variation of the cross-sectional area of the conductor cause the resistance variation. When the semiconductor material is stressed to produce the strain, the resistance thereof is accordingly varied. Therefore, by accurately measure the resistance of the semiconductor material, the relationship of the variation amount of the resistance and the strain can be obtained, so as to achieve a purpose of measuring the strain value. A related theoretical equation of using a piezoresistive measuring device to measure a piezoresistive variation amount is as follows:

$$\frac{\Delta R}{R} = \sum_{i=1}^{3}\sum_{j=1}^{3} A'_{ij}\sigma'_{ij} + [\alpha_1 T + \alpha_2 T^2 + \ldots \,] \quad (1)$$

Where, R is a resistance of the internal chip of the IC device 102, and ΔR is a variation amount of the resistance. Moreover, $A'_{ij}$ is a transition matrix, $A'_{ij}=A'_{ij}(\pi_{kl}, \phi, [\alpha_{kl}])$, $\alpha_1$, $\alpha_2$ are thermal expansion coefficients of the material, $\pi_{kl}$ is a piezoresistive constant of the material, $[\alpha_{kl}]$ is a coordinate axis transition matrix, and φ is an angle between the piezoresistive measuring device and the coordinate axis, as that shown in FIG. 1C. $\sigma'_{ij}$ is a stress value, which can also be represented in form of a matrix. T is a temperature.

According to the above equation (1), it is known that as long as the resistance and the variation amount of the resistance of the internal chip of the IC device 102 of FIG. 1A are obtained, the analysis module 104 can calculate the stress/strain of the IC device 102.

Regarding the piezoresistive measuring device made of an isotropic homogeneous piezoresistive material (for example, metal), if the piezoresistive measuring device is parallel to the coordinate axis (φ=0°, the equation (1) can be simplified as:

$$\frac{\Delta R}{R} = \pi\sigma + \alpha\Delta T. \quad (2)$$

According to the equation (2), it is known that if the piezoresistive constant of the material is $1000\times10^{-12}$(1/Pa), the thermal expansion coefficient of the material is $1000\times 10^{-6}$(1/° C.), and in case of a constant temperature (ΔT=0), if the piezoresistive variation amount is 0.1%, the stress value is about $10^6$ Pa (i.e. 1 MPa) according to a reverse calculation.

Moreover, the testing apparatus of the disclosure may use a heater to simulate the temperature of the chip, so that the principle that the temperature variation of the material causes a tiny variation of the resistance of the material can be used to first obtain a temperature coefficient of resistance (TCR) of the testing apparatus itself before the stress/strain is actually measured, so as to obtain a correct resistance of the apparatus.

The temperature dependence of conductors can be described by the approximation below.

$$\rho(T) = \rho_0[1 + \alpha_0(T - T_0)]$$

where $$\alpha_0 = \frac{1}{\rho_0}\left[\frac{\delta\rho}{\delta T}\right]_{T=T_0}$$

ρ0 just corresponds to the specific resistance temperature coefficient at a specified reference value (normally T=0° C.).

A positive temperature coefficient refers to materials that experience an increase in electrical resistance when their temperature is raised. Materials which have useful engineering applications usually show a relatively rapid increase with temperature, i.e. a higher coefficient. The higher the coefficient, the greater an increase in electrical resistance for a given temperature increase.

Several exemplary embodiments are provided below to describe an internal structure of the measuring apparatus of the disclosure.

Figure 2A:
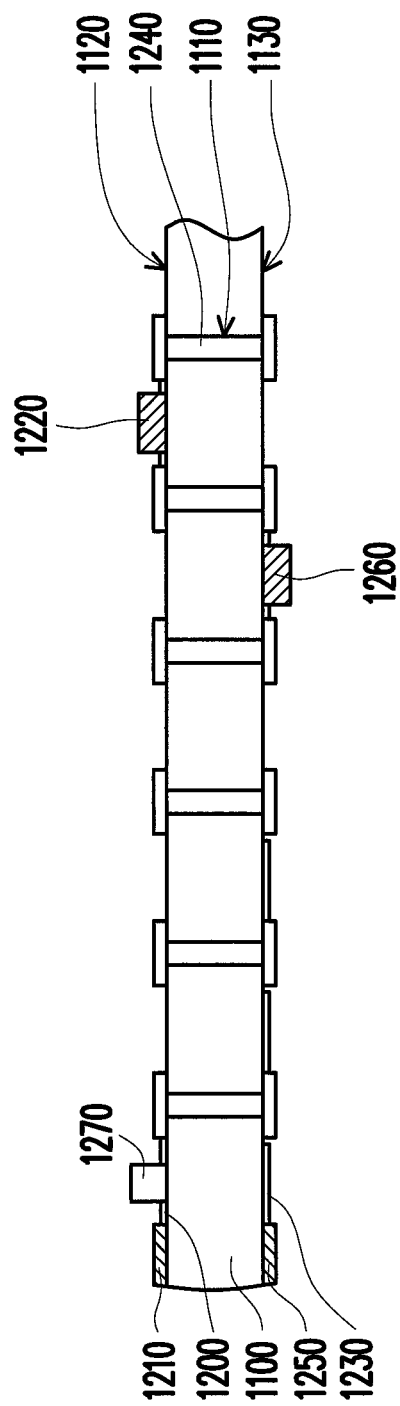
FIG. 2A is a diagram illustrating a partial package structure of a measuring apparatus according to another exemplary embodiment of the disclosure.

FIG. 2A is a diagram illustrating a partial package structure of a measuring apparatus according to another exemplary embodiment of the disclosure. Referring to FIG. 2A, the measuring apparatus 1000 of the present exemplary embodiment includes a chip 1100, a circuit layer 1200, a heater 1210, a stress sensor 1220 and a circuit layer 1230. The chip 1100 has a plurality of through silicon vias 1110, a surface 1120 and a surface 1130 opposite to the surface 1120, though a number of the through silicon vias 1110 can be only one. The circuit layer 1200 is disposed on the surface 1120. The heater 1210 is disposed on the surface 1120 and is electrically connected to the circuit layer 1200. The stress sensor 1220 is disposed on the surface 1120 and is electrically connected to the circuit layer 1200. The circuit layer 1230 is disposed on the surface 1130.

Figure 2B:
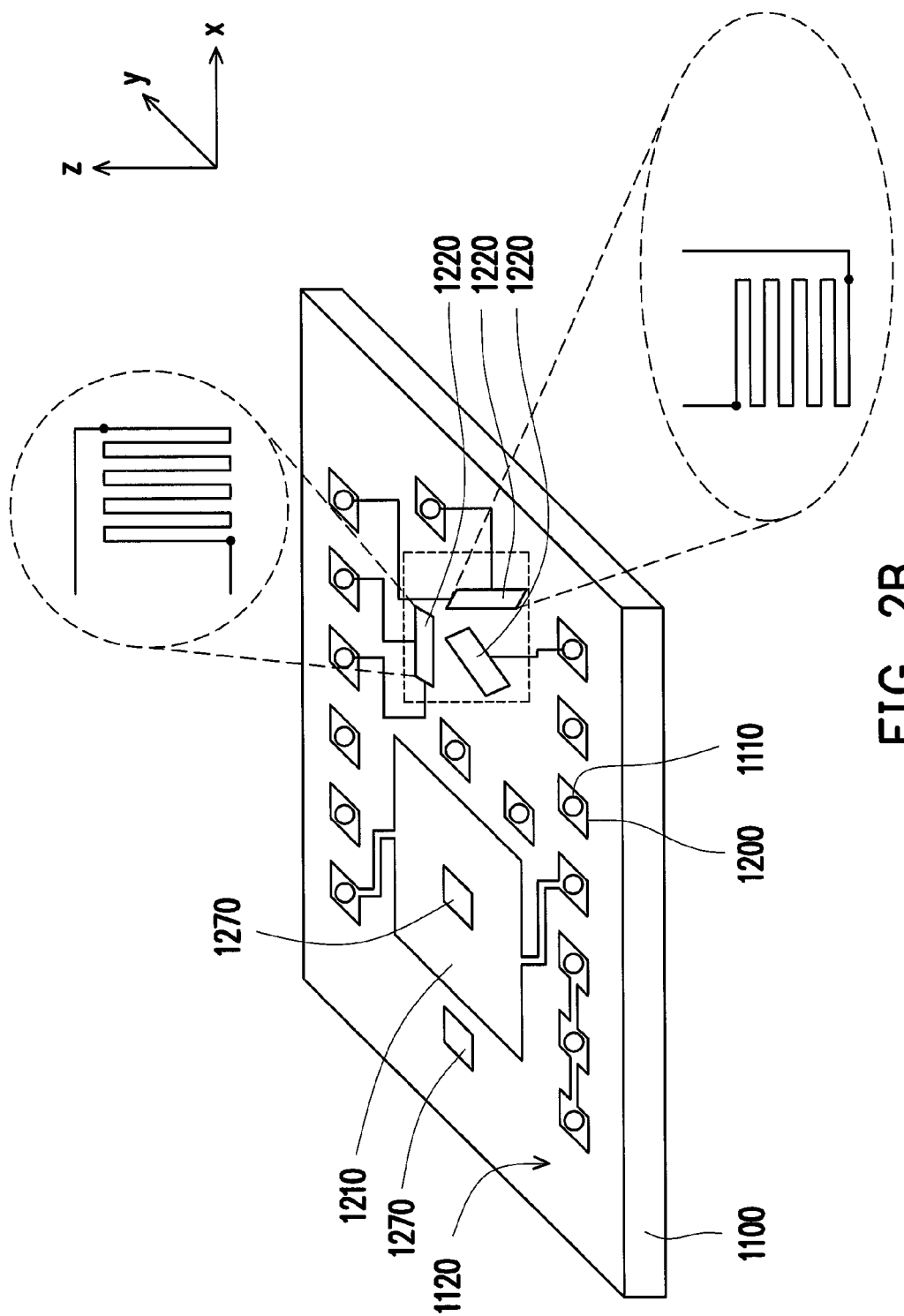
FIG. 2B is a three-dimensional view of the testing apparatus of FIG. 2A.
Figure 2C:
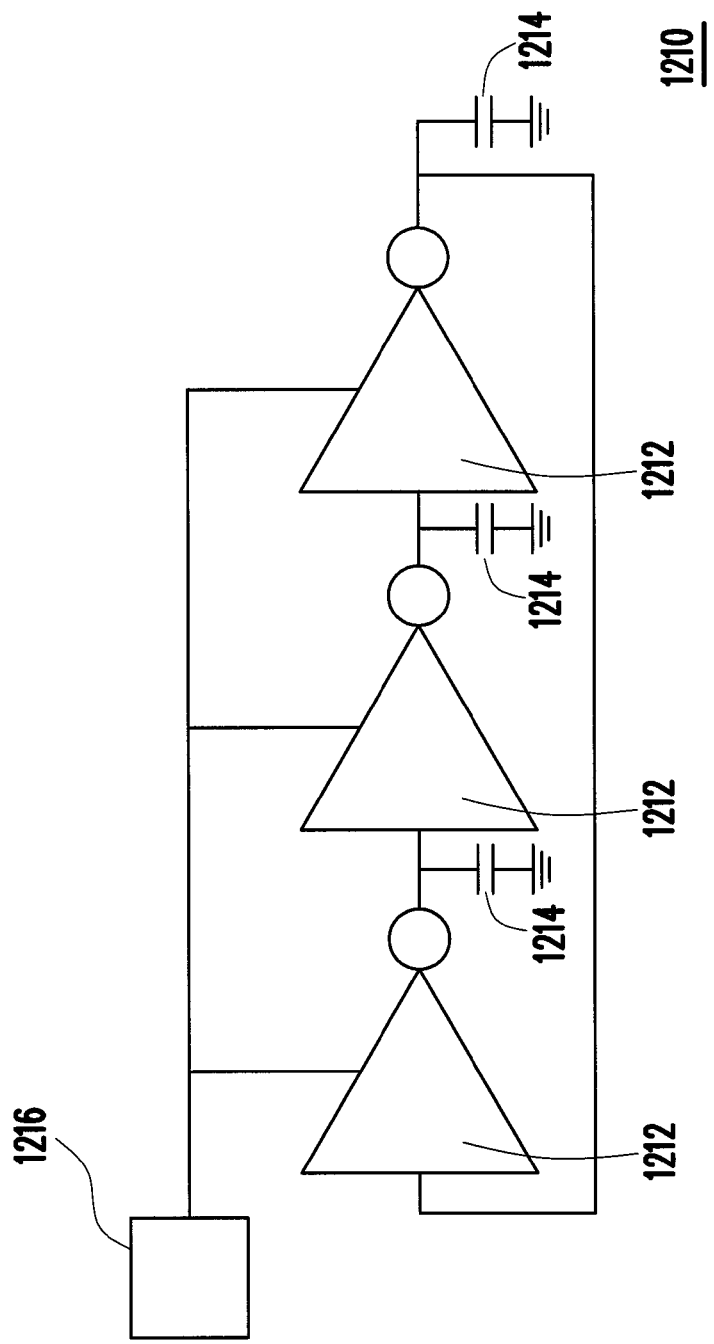
FIG. 2C is a diagram illustrating the heater of the measuring apparatus of FIG. 2A.

FIG. 2C is a diagram illustrating the heater of the measuring apparatus of FIG. 2A. Referring to FIG. 2C, the heater 1210 comprises a plurality of switches 1212 connected in series for receiving pulse signals from an external source (not shown) to generate heat. The heater 1210 composed of switches 1212 can be made within a tiny area but provides intensive heat, so as to simulate high temperature condition in commercial chip packages. More switches 1212 used in one heater 1210 can generate higher temperature. Power consumption of the heater 1210 can be predicted precisely. Therefore, the measuring apparatus with the heater 1210 satisfy user's requirement corresponding to various commercial chip packages.

In the exemplary embodiment, the heater 1210 comprises three switches 1212 and three capacitors 1214. The switches 1212 are inverters. An output terminal of one of the inverters is connected to an input terminal of another one of the inverters for forming a ring circuit. A delay time of each switch 1212 can be adjusted by varying physical size of the switch 1212. Otherwise, the delay time of each switch 1212 can be also adjusted by varying power supply voltage applied to the switch. Power consumption of the heater 1210 of the exemplary embodiment can be determined by summing power consumption of all switches 1212 that constitute the heater 1210. Power consumption of each switch 1212 is the product of capacitance of the corresponding capacitor 1214, square of working voltage of the switch 1212, duty cycle of pulse signal input to the switch 1212 and frequency of pulse signal input to the switch 1212. The switches 1212 are connected to a control terminal 1216 for adjusting the delay time of the switches 1212. That is, the frequency of pulse signal input to the switch 1212 can be adjusted by the control terminal 1216. Therefore, the quantity of heat generated by the heater 1210 can be adjusted by the control terminal 1216.

Figure 2D:
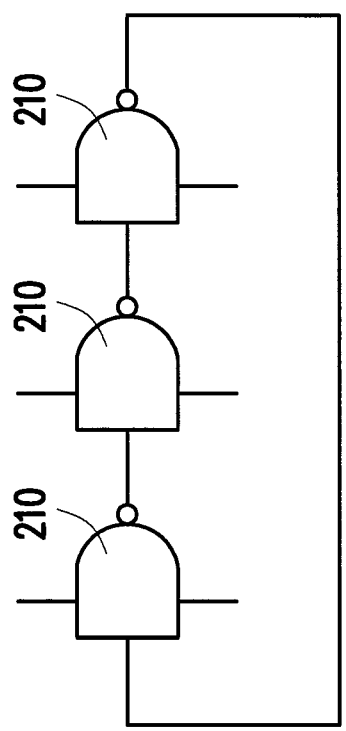
FIG. 2D is a diagram illustrating the heater with different type.

The heater of another embodiment may include elements other than inverters for generating heat, such as FIG. 2D. The heater 200 of FIG. 2D includes a series of NAND logic gates 210 for constituting an oscillator. The heater 200 can be substituted for the heater 1210 of FIG. 2B. Otherwise, the heater of another embodiment may include logic gates or other circuits for achieving signal inversing.

Referring to FIG. 2B, the measuring apparatus 1000 may further comprise at least one temperature sensing device 1270 disposed on the first surface 1120 and electrically connected to the circuit layer 1200 (only shown in FIG. 2A). In the exemplary embodiment of FIG. 2B, two temperature sensing devices 1270 are electrically connected to the circuit layer 1200. One temperature sensing device 1270 is surrounded by the heater 1210, and another one temperature sensing device 1270 is at vicinity of the heater 1210. The temperature sensing devices 1270 are used for sensing real time temperature of the location where the temperature sensing devices 1270 are. The temperature sensing devices 1270 can be diodes or other types of temperature sensing devices.

Here, the circuit layer 1200 is a general term of all circuits disposed on the surface 1120, and the circuit layer 1200 may include a plurality of independent circuits. The heater 1210 obtains an operation power through the circuit layer 1200, and the stress sensor 1220 outputs a sensing signal through the circuit layer 1200. The circuit layer 1230 is a general term of all circuits disposed on the surface 1130, and the circuit layer 1230 may include a plurality of independent circuits. The stress sensor 1220 can be a commonly used strain gauge or other types of stress sensors in the market, and the commonly used strain gauge in the market is also formed by a circuit with a special layout pattern, so as to facilitate obtaining stress information of various directions.

The measuring apparatus 1000 of the present exemplary embodiment may further include a plurality of conductor devices 1240 disposed in the through silicon vias 1110. A number of the conductor devices 1240 is determined according to a number of the through silicon vias 1110. The conductor devices 1240 can be only connected to the circuit layer 1200, or can be only connected to the circuit layer 1230, or can be simultaneously connected to both of the circuit layers 1200 and 1230, electrically. When the upper and lower surfaces of the chip 1100 have other devices disposed thereon, the conductor devices 1240 can be used to only connect the other devices on the upper and lower surfaces of the chip 1100 without connecting the circuit layers 1200 and 1230. The measuring apparatus 1000 of the present exemplary embodiment may further include a heater 1250, which is disposed on the surface 1130 and is electrically connected to the circuit layer 1230, and a function of the heater 1250 is similar to that of the heater 1210. The measuring apparatus 1000 of the present exemplary embodiment may further include a stress sensor 1260, which is disposed on the surface 1130 and is electrically connected to the circuit layer 1230, and a function of the stress sensor 1260 is similar to that of the stress sensor 1220.

The stress sensors 1220 and 1260 may sense stress of the upper surface 1120 of the chip 1100, and generate corresponding sensing signals, for example, the sensing signals S1 in FIG. 1A. In the present exemplary embodiment, the stress sensors 1220 and 1260 can be fabricated through a conductor and semiconductor material technique or a wafer thick-film and a semiconductor fabrication technique, and a material thereof is a material with relatively great resistance such as copper, aluminium, polysilicon, etc. In the disclosure, since the stress sensors can transmit the sensing signals to the output terminal through the conductor devices and the bumps, in some exemplary embodiments of the disclosure, the stress sensors can also be disposed at any positions on the chip.

In the present exemplary embodiment, since the stress sensors 1220 and 1260 can be respectively disposed at corresponding positions on the upper and lower surfaces 1120 and 1130 of the chip 1100, not only stresses/strains of the upper surface 1120 and the lower surface 1130 of the chip 1100 can be sensed, stresses/strains of the chip 1100 in three-dimensional directions can also be analysed.

FIG. 2B is a three-dimensional view of the testing apparatus of FIG. 2A, though FIG. 2A is not a single cross-sectional view of FIG. 2B. Distributions of various devices on a surface 1120 of the chip 1100 can be obtained according to FIG. 2B, for example, switches of the heater 1210, the plurality of stress sensors 1220 within the dash line area and the circuit layer 1200. The circuit layer 1200 can be connected to internal devices of the chip 1100 and devices on another surface of the chip 1100 through the through silicon vias 1110.

FIG. 3A is a schematic diagram illustrating stresses/strains of the chip in three-dimensional directions. According to FIG. 3A, it is obvious that the upper surface 1120 of the chip 1100 bears a stress, so that a strain is generated on an X-Y plane, and a displacement thereof is assumed to be u1. Moreover, the lower surface 1130 of the chip 1100 also generates a strain on the X-Y plane due to the stress, and a displacement thereof can be u2. While the upper surface 1120 and the lower surface 1130 of the chip 1100 generate the strains, the chip 1100 may generate a strain along a Z-direction. According to FIGS. 3A and 3B, it is obvious that a thickness of the chip 1100 along the Z-direction is changed from z1 to z2.

A Pythagorean theorem can be used to obtain a length of z2, and a mathematic equation thereof is as follows:

$$z2\sqrt{=z1^2+(u1-u2)^2} \qquad (2).$$

An equivalent geometric figure thereof is as that shown in FIG. 3B. Therefore, in the present exemplary embodiment, as long as the stresses/strains of the upper surface 1120 and the lower surface 1130 of the chip 1100 are calculated, the stresses/strains of the chip 1100 in the three-dimensional directions can be simultaneously obtained.

A material of the conductor device 1240 can be a piezoelectric material, and the material of the conductor devices 1240 can also be a polysilicon material or silicon doped with phosphorus. As described above, the stress sensor 1220 can measure stresses/strains of the chip 1100 in two-dimensional directions. By using the stress sensors 1220 and 1260, stresses/strains of the chip 1100 in three-dimensional directions can be further measured. Moreover, by measuring a resistance variation of the conductor device 1240, a stress/ strain of the chip 1100 in a thickness direction can be obtained. Since the conductor device 1240 directly passes through the internal of the chip 1100, the stress/strain of the chip 1100 in the thickness direction can be accurately measured. In addition, when the conductor device 1240 is used for measuring the stress/strain, even if the stress sensor 1220 is not used, the stresses/strains of the chip 1100 in the three-dimensional directions can still be measured.

Figure 4:
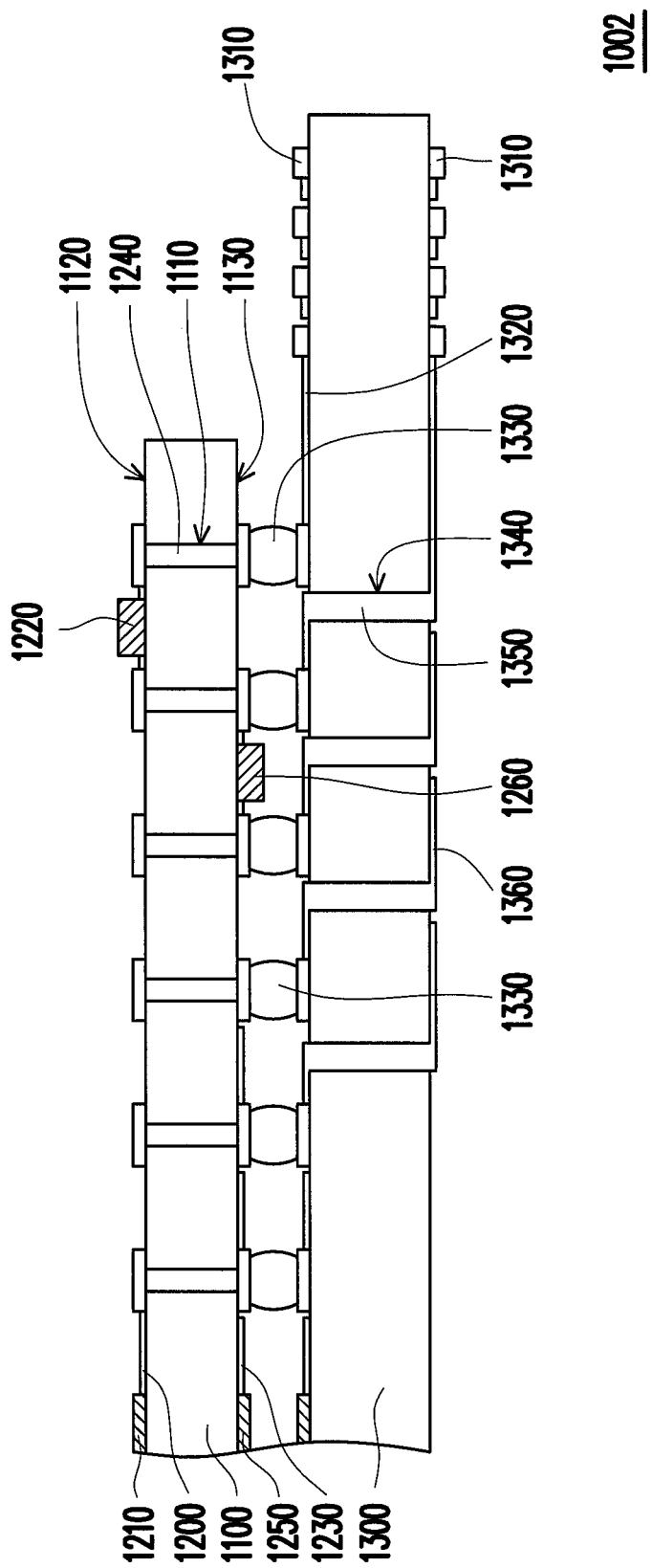
FIG. 4 is a diagram illustrating a partial package structure of a measuring apparatus according to another exemplary embodiment of the disclosure.

FIG. 4 is a diagram illustrating a partial package structure of a measuring apparatus according to another exemplary embodiment of the disclosure. Referring to FIG. 4, the measuring apparatus 1002 of the present exemplary embodiment is similar to the measuring apparatus 1000 of FIG. 2A, so that only differences there between are introduced below. The measuring apparatus 1002 of the present exemplary embodiment further includes a substrate 1300, a plurality of pads 1310 and a circuit layer 1320. The chip 1100 is disposed on the substrate 1300 through a plurality of bumps 1330. The pads 1310 and the circuit layer 1320 are disposed on the substrate 1300, and the circuit layer 1230 is electrically connected to the pads 1310 through the bumps 1330 and the circuit layer 1320. A signal detected by the stress sensor 1220 can be transmitted to the pads 1310 sequentially through the circuit layer 1200, the conductor devices 1240, the bumps 1330 and the circuit layer 1320. The analysis module 104 of FIG. 1A obtains the signal detected by the stress sensor 1220 through the pads 1310, and analyses the signal to obtain the stress/strain of the chip 1100. Similarly, a signal detected by the stress sensor 1260 can be transmitted to the pads 1310 sequentially through the circuit layer 1230, the bumps 1330 and the circuit layer 1320. Moreover, the substrate 1300 may also have through substrate vias 1340, and conductor devices 1350 are disposed in the through substrate vias 1340. A circuit layer 1360 can be disposed on another surface of the substrate 1300. The circuit layer 1360 is electrically connected to the conductor devices 1350 and the pads 1310 on the same surface of the substrate 1300.

Figure 5:
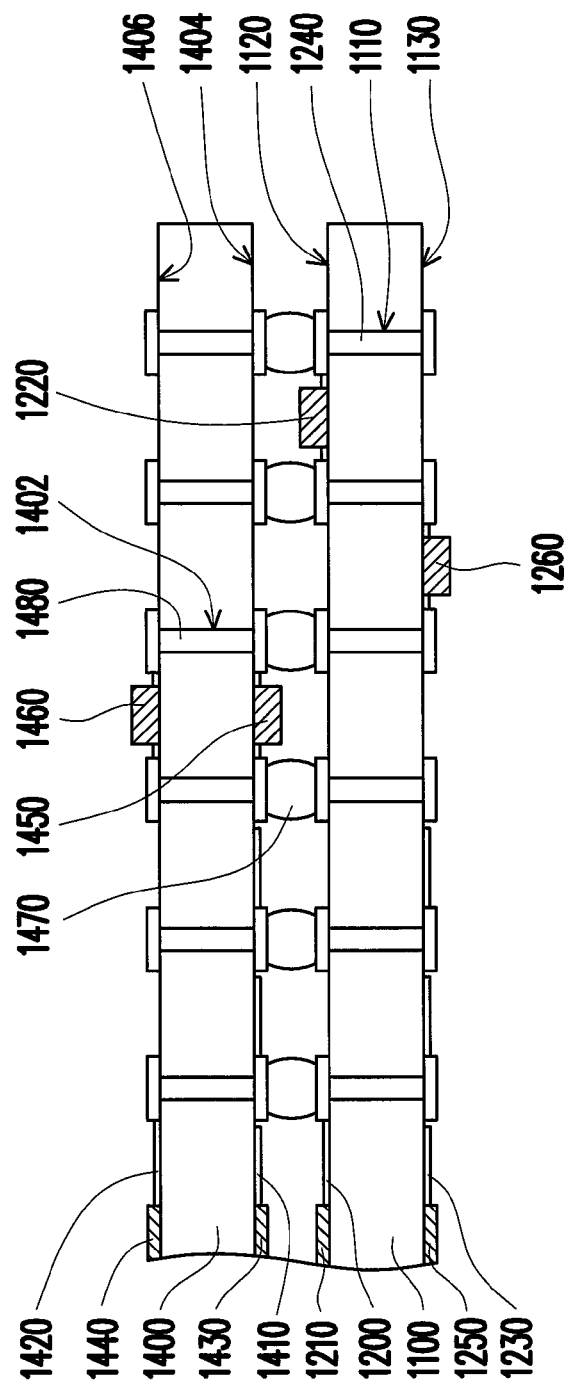
FIG. 5 is a diagram illustrating a partial package structure of a measuring apparatus according to another exemplary embodiment of the disclosure.

FIG. 5 is a diagram illustrating a partial package structure of a measuring apparatus according to another exemplary embodiment of the disclosure. Referring to FIG. 5, the measuring apparatus 1004 of the present exemplary embodiment is similar to the measuring apparatus 1000 of FIG. 2A, so that only differences there between are introduced below. The measuring apparatus 1004 of the present exemplary embodiment further includes a chip 1400, circuit layers 1410 and 1420, heaters 1430 and 1440, stress sensors 1450 and 1460, and a plurality of bumps 1470. The chip 1400 has a plurality of through silicon vias 1402 and surfaces 1404 and 1406 opposite to each other. The circuit layer 1410 is disposed on the surface 1404. The heater 1430 and the stress sensor 1450 are disposed on the surface 1404 and are electrically connected to the circuit layer 1410. The heater 1440 and the stress sensor 1460 are disposed on the surface 1406 and are electrically connected to the circuit layer 1420. The chip 1400 is stacked on the chip 1100 through the bumps 1470, and the circuit layer 1410 is electrically connected to the circuit layer 1200 through the bumps 1470. The circuit layer 1420 is disposed on the surface 1406. The measuring apparatus 1004 of the present exemplary embodiment may further includes a plurality of conductor devices 1480 disposed in the through silicon vias 1402. The conductor devices 1480 are electrically connected to the circuit layer 1410 and/or the circuit layer 1420. A function of the conductor devices 1480 is similar to that of the conductor devices 1240 of FIG. 2A, so that detailed descriptions thereof are not repeated. The measuring apparatus 1004 of the present exemplary embodiment is a three-dimensional stacking-type chip structure, so that stresses/strains of an actual three-dimension stacking-type chip structure having the same structure under various temperatures can be simulated and measured.

Figure 6:
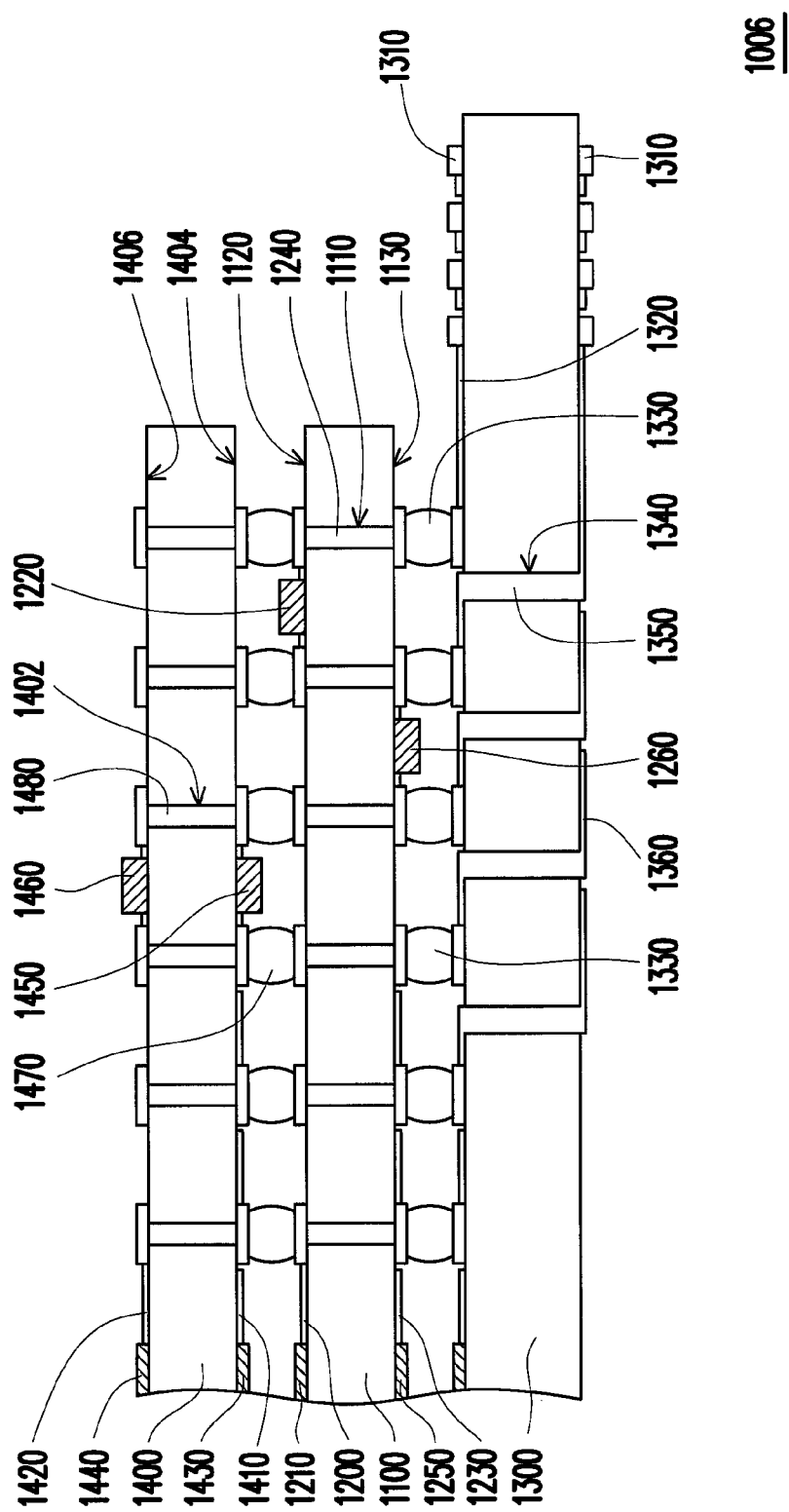
FIG. 6 is a diagram illustrating a partial package structure of a measuring apparatus according to another exemplary embodiment of the disclosure.

FIG. 6 is a diagram illustrating a partial package structure of a measuring apparatus according to another exemplary embodiment of the disclosure. Referring to FIG. 6, the measuring apparatus 1006 of the present exemplary embodiment is approximately a combination of the measuring apparatus 1002 of FIG. 4 and the measuring apparatus 1004 of FIG. 5. Namely, the measuring apparatus 1006 of the present exemplary embodiment is mainly formed by stacking the chip 1400, the chip 1100 and the substrate 1300.

In summary, in the aforementioned exemplary embodiments, the sensors are used to measure resistances of the chip when the chip is deformed, and accordingly generate the sensing signals. The sensing signals can be transmitted to the output terminal of the substrate through the conductor devices and the bumps. In this way, the stresses/strains of the chip can be analysed and calculated according to the sensing signals.

Moreover, since the sensing signals are transmitted through the conductor devices and the bumps, it is unnecessary to transmit the sensing signals through an additional wire bonding approach, so that allocation of the sensors can be more flexible. Further, since allocation of the sensors is more flexible, the stresses/strains of the chip in the three-dimensional directions can be measured.

Moreover, the measuring apparatus of the disclosure may use heaters to simulate various operating temperatures, so as to facilitate measuring the temperature of the chip and converting it to a thermal resistance of the chip.

Since the measuring apparatus of the disclosure has the through silicon vias, when a temperature and a stress/strain variation of the upper surface of the chip are required to be measured, the corresponding signals can be directly transmitted to the pads on the substrate through the through silicon vias without using a wire bonding process to transmit the signals of the upper surface of the chip to the substrate. Therefore, not only the temperatures and stress/strain variations of the upper and lower surfaces of any layer of the chip can be obtained, the signal variation in internal of each chip can also be directly obtain. The through silicon vias of the disclosure can also be used to measure a stress/strain of the chip in a thickness direction, so as to measure the stresses/strains of the chip in the three-dimensional directions in collaboration with the sensor 1220.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A measuring apparatus, comprising:
   a first chip, having a first through silicon via, a first surface and a second surface opposite to the first surface;
   a first circuit layer, disposed on the first surface;
   a first heater, disposed on the first surface, and electrically connected to the first circuit layer, wherein the first heater comprises a plurality of first switches connected in series to generate heat;
   a first stress sensor, disposed on the first surface, and electrically connected to the first circuit layer; and
   a second circuit layer, disposed on the second surface.

2. The measuring apparatus as claimed in claim 1, further comprising a conductor device disposed in the first through silicon via.

3. The measuring apparatus as claimed in claim 2, wherein the conductor device is electrically connected to the first circuit layer.

4. The measuring apparatus as claimed in claim 2, wherein the conductor device is electrically connected to the second circuit layer.

5. The measuring apparatus as claimed in claim 2, wherein the conductor device is electrically connected to the first circuit layer and the second circuit layer.

6. The measuring apparatus as claimed in claim 2, wherein a material of the conductor device is a piezoelectric material.

7. The measuring apparatus as claimed in claim 2, wherein a material of the conductor device is a polysilicon material or silicon doped with phosphorus.

8. The measuring apparatus as claimed in claim 1, further comprising a second heater disposed on the second surface and electrically connected to the second circuit layer.

9. The measuring apparatus as claimed in claim 1, further comprising a second stress sensor disposed on the second surface and electrically connected to the second circuit layer.

10. The measuring apparatus as claimed in claim 1, further comprising a substrate, a plurality of pads and a third circuit layer, wherein the first chip is disposed on the substrate through a plurality of bumps, the pads and the third circuit layer are disposed on the substrate, and the second circuit layer is electrically connected to the pads through the bumps and the third circuit layer.

11. The measuring apparatus as claimed in claim 1, further comprising:
a second chip, having a second through silicon via, a third surface and a fourth surface opposite to the third surface;
a third circuit layer, disposed on the third surface;
a second heater, disposed on the third surface, and electrically connected to the third circuit layer, wherein the second heater comprises a plurality of second switches connected in series to generate heat;
a plurality of bumps, wherein the second chip is disposed on the first chip through the bumps, and the third circuit layer is electrically connected to the first circuit layer through the bumps;
a second stress sensor, disposed on the third surface, and electrically connected to the third circuit layer; and
a fourth circuit layer, disposed on the fourth surface.

12. The measuring apparatus as claimed in claim 11, further comprising a conductor device disposed in the second through silicon via.

13. The measuring apparatus as claimed in claim 12, wherein the conductor device is electrically connected to the third circuit layer.

14. The measuring apparatus as claimed in claim 12, wherein the conductor device is electrically connected to the fourth circuit layer.

15. The measuring apparatus as claimed in claim 12, wherein the conductor device is electrically connected to the third circuit layer and the fourth circuit layer.

16. The measuring apparatus as claimed in claim 12, wherein a material of the conductor device is a piezoelectric material.

17. The measuring apparatus as claimed in claim 12, wherein a material of the conductor device is a polysilicon material or silicon doped with phosphorus.

18. The measuring apparatus as claimed in claim 11, further comprising a third heater disposed on the fourth surface and electrically connected to the fourth circuit layer.

19. The measuring apparatus as claimed in claim 11, further comprising a third stress sensor disposed on the fourth surface and electrically connected to the fourth circuit layer.

20. The measuring apparatus as claimed in claim 1, further comprising at least one temperature sensing device disposed on the first surface and electrically connected to the first circuit layer.

21. The measuring apparatus as claimed in claim 20, wherein the temperature sensing device is a diode.

22. The measuring apparatus as claimed in claim 20, wherein the temperature sensing device is surrounded by the heater.

23. The measuring apparatus as claimed in claim 20, wherein the temperature sensing device is at vicinity of the heater.

24. The measuring apparatus as claimed in claim 1, wherein a delay time of the first switches is adjusted by varying sizes of the first switches or varying power supply voltage applied to the first switches.

25. The measuring apparatus as claimed in claim 1, wherein the first switches are inverters.

26. The measuring apparatus as claimed in claim 25, wherein an output terminal of each of the inverters is connect to an input terminal of another one of the inverters.

27. The measuring apparatus as claimed in claim 25, wherein the inverters are connected to a control terminal for adjusting a delay time of the inverters.

28. The measuring apparatus as claimed in claim 1, wherein the first switches are NAND logic gates.

* * * * *